United States Patent [19]
Kobayashi

[11] Patent Number: 5,083,183
[45] Date of Patent: Jan. 21, 1992

[54] SEMICONDUCTOR DEVICE AND METHOD FOR PRODUCING THE SAME

[75] Inventor: Hitoshi Kobayashi, Tochigi, Japan

[73] Assignee: Nippon Precision Circuits Ltd., Tokyo, Japan

[21] Appl. No.: 554,235

[22] Filed: Jul. 17, 1990

[30] Foreign Application Priority Data

Jul. 27, 1989 [JP] Japan .................. 1-195175

[51] Int. Cl.$^5$ ............................................ H01L 27/02
[52] U.S. Cl. ...................... 357/51; 357/59; 357/71
[58] Field of Search ................ 357/51, 59, 71

[56] References Cited

U.S. PATENT DOCUMENTS 4,948,747  8/1990  Pfiester .................. 357/51
4,961,103 10/1990  Saitoh et al. .......... 357/51

Primary Examiner—Andrew J. James
Assistant Examiner—T. Davenport
Attorney, Agent, or Firm—Jordan and Hamburg

[57] ABSTRACT

A resistor for a semiconductor device includes a thin film resistor layer sandwiched between thin film silicon layers. A thin film silicon oxide layer formed on the upper silicon layer prevents oxidation of the upper silicon layer, so that the upper silicon layer serves as a stopper for subsequent etching of the device to provide contacts for the resistor.

1 Claim, 2 Drawing Sheets

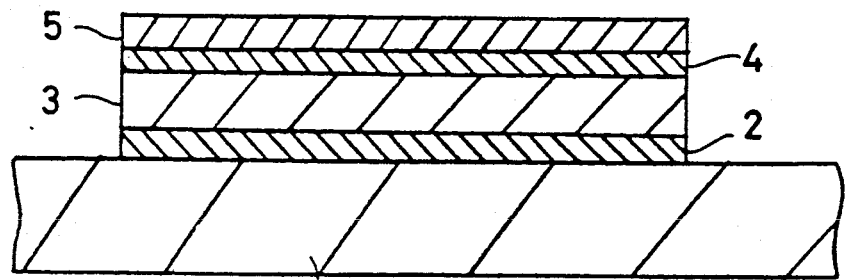
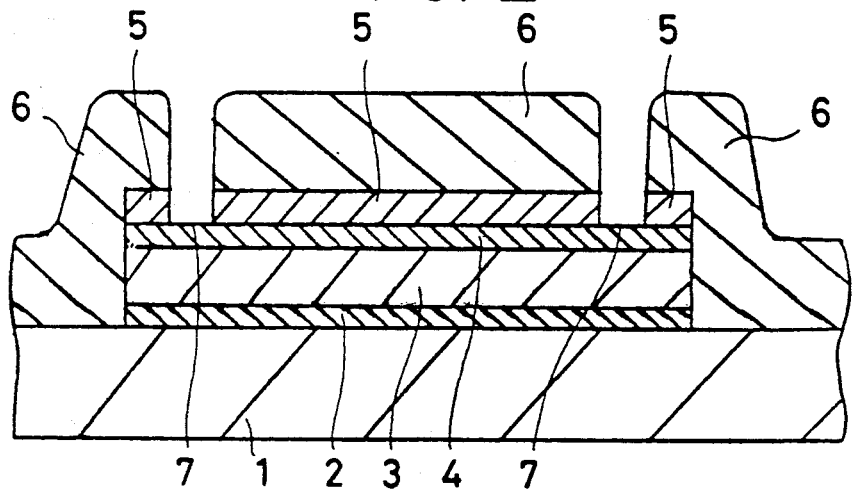
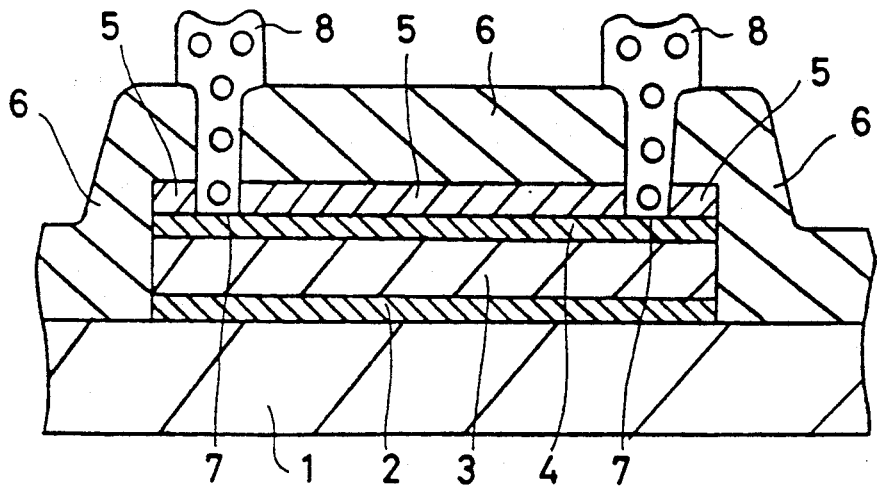

SEMICONDUCTOR DEVICE AND METHOD FOR PRODUCING THE SAME

FIELD OF THE INVENTION

The present invention relates to a semiconductor device and the method for producing the same.

BACKGROUND OF THE INVENTION

When a resistor element is formed in a semiconductor device such as an integrated circuit and the like, frequently a resistor thin film is formed between silicon thin films. In this arrangement, the silicon thin film protects the resistor thin film.

FIG. 4 shows an example of this arrangement in which a resistor element having the above described structure was used in an integrated circuit.

In FIG. 4, numeral 11 denotes an insulating layer which has been formed on a semiconductor substrate (not shown in the figure). Numeral 12 denotes a silicon layer formed in thin film-like form, numeral 13 denotes a resistor layer formed in thin film-like form on this silicon layer 12, and numeral 14 denotes a silicon layer formed on this resistor layer 13. Numeral 16 is a protective insulating layer for which silicon oxide is ordinarily used. Numeral 18 denotes a metal layer which is connected to the resistor layer 13 via a contact hole 17.

In the above described conventional resistor element, the film thickness of the silicon layers 12 and 14 has been restricted for the following reasons. When the film is too thin, the silicon layers 12 and 14 can not sufficiently protect the resistor layer 13. On the other hand, when the film thickness is too great, a eutectic reaction is generated between the silicon layer 14 and the metal layer 18, and the resistance value changes. Due to this fact, the film of the silicon layer 14 is restricted to have a thickness such as 3 nanometers, and the control of the thickness of the silicon layer 14 is difficult.

In addition, in the above-described conventional resistance element, since the surface of the silicon layer 14 is exposed to the atmosphere during production procedure, the silicon layer 14 is oxidized to form silicon oxide. As a result, when a contact hole is formed by etching the protective insulating layer 16, the silicon layer 14, which is intended to function primarily as a stopper for etching, is also simultaneously etched. Consequently, even the resistor layer is subjected to the etching action, and such problems as bad contact to the resistor and change of the resistance value arise.

SUMMARY OF THE INVENTION

A first object of the present invention is to provide a semiconductor device in which the control of the film thickness is easy, and a method for producing the same.

A second object of the present invention is to provide a semiconductor device in which bad contacts and change of the resistance value do not occur, and a method for producing the same.

BRIEF DESCRIPTION OF THE DRAWINGS

In the following paragraph, an embodiment of the present invention will be disclosed with reference to the appended drawings.

FIGS. 1 to 3 are sectional diagrams of a production method in accordance with one embodiment of the present invention.

DESCRIPTION OF THE PREFERRED EMBODIMENTS

Figure 4:
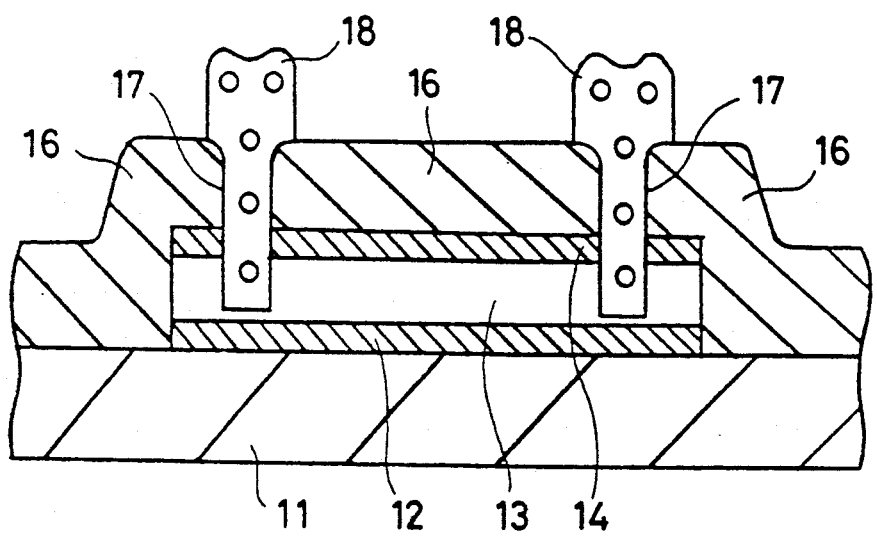
FIG. 4 is a sectional diagram which shows a conventional resistor.

FIGS. 1 to 3 illustrate an embodiment of the production method of the present invention. First an explanation will be given of the respective elements of the structure.

Numeral 1 denotes an under part insulating layer, which is formed by using an insulating material such as silicon oxide or the like on a silicon substrate (not shown in the drawings).

Numeral 2 denotes an under silicon layer and is formed with intrinsic silicon or impurity silicon doped with phosphorous, boron, etc.

Numeral 3 denotes a resistor layer which is formed with a CrSi system or a NiCr system.

Numeral 4 denotes an upper silicon layer which is formed of intrinsic silicon or impurity silicon doped with phosphorous (P), boron (B), etc.

Numeral 5 denotes a silicon oxide layer and is formed of silicon monoxide (SiO) or silicon dioxide ($SiO_2$) or a mixture thereof.

Numeral 6 denotes a protective insulating layer, and is formed by use of silicon oxide.

Numeral 7 denotes a contact part, and indicates the surface of the upper silicon layer which contacts the metal layer 8 described in the following paragraph.

Numeral 8 denotes a metal layer, for example of aluminum (Al) or about 1% of silicon is mixed with aluminum.

Next, an explanation will be given of the method of the invention.

Referring to FIG. 1, an under part insulating layer 1 is formed on a silicon semiconductor substrate (not shown in the figure). On this under part insulating layer 1, are successively formed an under silicon layer 2, a resistor layer 3, an upper silicon layer 4, and a silicon oxide layer 5, by a sputter evaporating method without breaking the vacuum. Since the upper silicon layer 4 is not exposed to the atmosphere, it is not oxidized. Therefore, it is possible to make the film of the upper silicon layer thin (less than 3 nanometers). Successively, the under silicon layer 2, resistor layer 3, upper silicon layer 4, and silicon oxide layer 5 are formed by subjecting the structure to patterning in predetermined forms.

As seen in FIG. 2, a protective insulating layer 6 is formed to cover the silicon layer 5 by use of the CVD method. Successively, in order to form a contact hole, the protective insulating layer 6 and the silicon oxide layer 5 are etched by using an etching liquid containing fluoric acid as a main component. Since the upper silicon layer 4 is not subjected to oxidation, it functions as a stopper of the etching, so that the resistor layer 3 is not etched. The surface of the upper silicon layer 4 exposed by etching becomes a contact part 7.

The metal layer 8 for the electrode for wiring use is then formed to contact the contact part 7 as shown in FIG. 3.

The above described method thus produces the semiconductor device as shown in FIG. 3.

In the present invention, since a silicon oxide layer is provided on the upper silicon layer, even when the film thickness of the upper silicon layer is thin, it can function as a protective film, and the control of the film thickness of the upper silicon layer is simplified.

In addition, since the upper silicon layer is not subjected to oxidation, the upper silicon layer works as a stopper of the etching when the protective insulating layer and the silicon oxide layer are etched, so that the resistor layer is not etched. Thereby, the bad contacts and the change of the resistance value that heretofore occurred can be decreased.

Although the invention is illustrated and described in relationship to specific embodiments, it is nevertheless not intended to be limited to the details shown, since various modifications and structural changes may be made therein without departing from the spirit of the invention and within the scope and range of equivalents of the claims.

What is claimed is:

1. A semiconductor device comprising a thin film under silicon layer having silicon as a main component and formed on a substrate, a thin film resistor layer formed on said under silicon layer, a thin film upper silicon layer having silicon as a main component on said resistor layer and having a contact part on a surface thereof, a thin film silicon oxide layer on said upper silicon layer except on the upper part of said contact part of said upper silicon layer, a protective insulating layer on said silicon oxide layer except on said upper part of said contact part of said upper silicon layer, and a metal layer contacting said contact part of said upper silicon layer and laterally contacting said thin film oxide layer.

* * * * *